United States Patent [19]

Logerot et al.

[11] 4,221,448

[45] Sep. 9, 1980

[54] CONNECTOR FOR PRINTED CIRCUIT BOARDS

[75] Inventors: Bernard A. Logerot, Mont-sous-Vaudrey; Lucien L. Péchard; Jean-Claude A. Bouley, both of Dole, all of France

[73] Assignee: Bunker Ramo Corporation, Oak Brook, Ill.

[21] Appl. No.: 916,831

[22] Filed: Jun. 19, 1978

[30] Foreign Application Priority Data

Jun. 23, 1977 [FR] France ............................... 77 19271

[51] Int. Cl.[3] ............................................ H05K 1/07

[52] U.S. Cl. ......................... 339/75 MP; 339/176 MP

[58] Field of Search ............. 339/17 L, 75 M, 75 MP, 339/91 R, 176 MP

[56] References Cited

U.S. PATENT DOCUMENTS

| | | | |
|---|---|---|---|
| 3,188,598 | 6/1965 | Pferd | 339/75 MP |
| 3,920,302 | 11/1975 | Cutchaw | 339/75 MP |

FOREIGN PATENT DOCUMENTS

| | | | |
|---|---|---|---|
| 1200409 | 9/1965 | Fed. Rep. of Germany | 339/91 R |
| 1916468 | 10/1970 | Fed. Rep. of Germany | 339/176 MP |
| 1073679 | 3/1954 | France | 339/91 R |
| 1391864 | 2/1965 | France | 339/176 MP |
| 44-22981 | 9/1969 | Japan | 339/75 MP |

*Primary Examiner*—Neil Abrams

*Attorney, Agent, or Firm*—F. M. Arbuckle; T. J. Haller

[57] ABSTRACT

A connector having a resilient contact that makes a rolling contact with the conductor pads of a printed circuit board instead of a wiping contact therewith. According to the invention, a resilient contact has a first portion which is initially in the path of a board to be inserted in the connector and is displaced along the path as the card is inserted. A second portion of the resilient contact has a bulge which follows in the direction of movement of the first portion, but applies a continually increasing lateral force against the conductor pad as the board continues to be inserted. The invention also includes a latching device for latching the circuit board securely in the connector body.

22 Claims, 19 Drawing Figures

Fig. 7
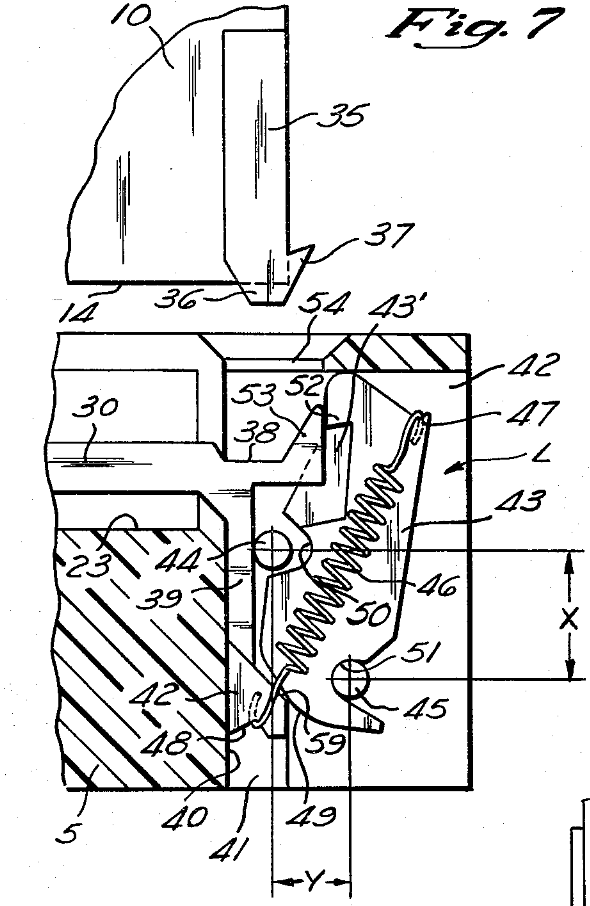
Fig. 8
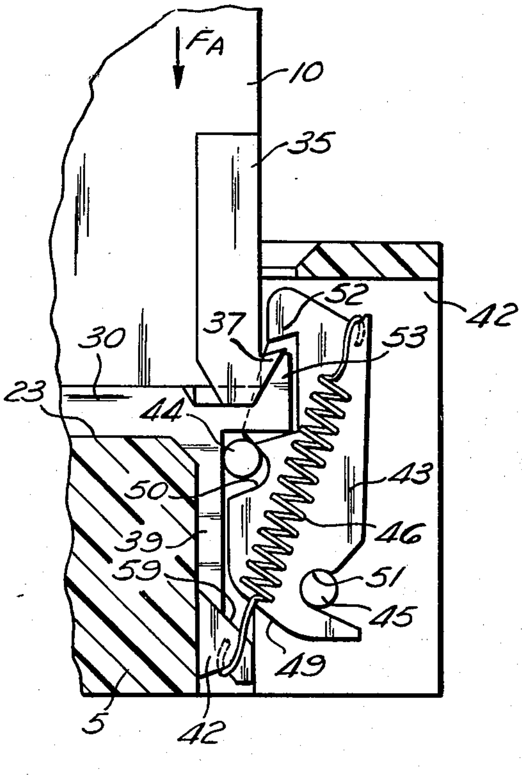
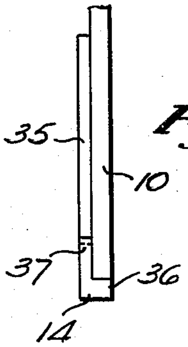
Fig. 11
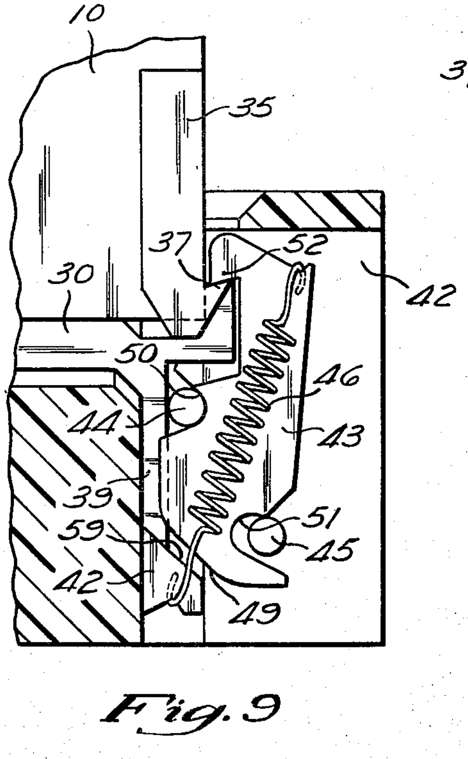
Fig. 9
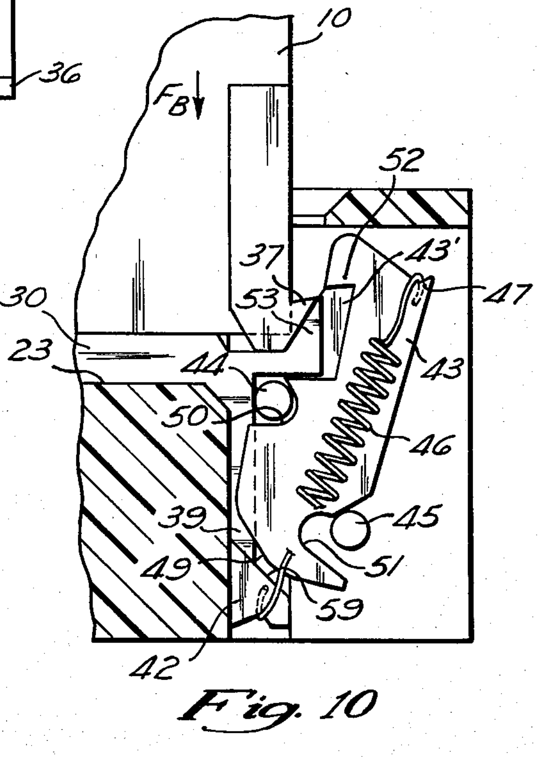
Fig. 10

CONNECTOR FOR PRINTED CIRCUIT BOARDS

TECHNICAL FIELD

The present invention relates to connectors for printed circuit boards, and more particularly to connectors permitting direct inserting and removal of printed circuit boards without risk of damage to the conductor pads of the board.

BACKGROUND OF PRIOR ART

It is common practice to provide a printed circuit board, along at least one of its edges, with a series of conductive paths lying parallel to one another and perpendicular to the edge of the board. These conductive paths end in terminal connection zones or conductor pads and form an integral part of the printed circuit wiring on the board, i.e., the conductor pads are produced from the same layer of conductive material as the printed circuit interconnection wiring and are produced by the same process of fabrication. The conductor pads are, consequently, very fragile, and this causes problems in making connection with other conductors or connectors of an electrical apparatus.

Specifically, it is extremely difficult to insert directly the edge of a circuit board into a female connector having a large plurality of contacts of the lyre type, such as is commonly in use today. In the lyre type of connector, the resilient contact blades are shaped to receive one end of a board and to clamp the end of the board in a connector body of insulating material. The free ends of the contacts are generally bent inwardly and then outwardly and upwardly so as to offer, prior to insertion, a lesser width of passage than the width of the board itself. In this manner, by applying an insertion force against the board, the curved parts of the receiving contacts are displaced and apply lateral contact pressure forces upon the board. However, as the board is inserted, these lateral forces induce frictional forces upon the fragile contact pads of the board. The same deleterious effect is produced during extraction of the board. Since the resilient contact blades of the female connector are designed to exert lateral forces sufficient for establishing an electrical contact by pressure between the blades and the conductive pads of the board, the induced frictional forces are relatively large. Accordingly, the characteristics of the contact which enhance good electrical and mechanical connection, e.g., large lateral forces, are opposed to the characteristics which aid in reducing chipping and wear of the conductor pads on the board. The lateral forces thus act against the ideal principals of connection of circuit boards with mating contacts, i.e., to offer non-limiting and non-destructive extraction and insertion of the board.

It has been proposed to use an intermediate element in the shape of a connection bar fixed to the end of a printed circuit board, for example with screws, the intermediate element having terminals in the shape of tongues or pins and being permanently connected, as by soldering, with the conductor pads of the board. Connection is then made by means of the stronger terminals of this intermediate element attached to the board.

The use of an intermediate element has obvious disadvantages. For example, it constitutes a supplementary piece which adds to cost, maintenance, assembly, etc. In order to avoid the need for any intermediate element, a process has been proposed consisting in the hardening of the mechanical characteristics of the connector pads on the printed circuit board by coating the pads by a galvanic deposit process which, without harming the electrical qualities of the board, permits introduction of the board directly into a connector of the above-mentioned type with a relatively reduced rate of adverse incidences. However, in order to obtain simultaneously the characteristics of good electrical conduction and good mechanical hardness, the galvanic deposit is generally of rare metals such as nickel and/or rhodium, ie., materials that are mechanically more resistant to wear than the usual red copper of the printed circuit board, but equally more expensive.

Additionally, the coating process must be carried out with extreme precision in order to avoid improper depositing techniques which make the thus obtained contact surfaces abrasive and/or make the contacts susceptible of rapid deterioration during the process. The required precision and high quality standards of the process increase considerably the cost of production of such printed circuit boards.

It is often preferred in the prior art to deposit a less costly alloy of tin and lead instead of the rare metal deposit discussed above. The tin and lead alloy, if it covers the entire conductive wiring paths on the circuit board, has the additional advantage of effecting directly in a single operation the tinning of all of the copper parts of the board. This type of coating reduces the risks of flaking or scraping of the conductive terminal pads on the board, but it presents little advantage over bare copper itself, since it is extremely ductile and consequently not able to support large mechanical friction forces. Consequently, the utilization of the lyre type connectors is equally problematical with this type of coating, since the frictional forces developed during the insertion and extraction of the board are not compatible with the mechanical endurance of the coating.

BRIEF SUMMARY OF INVENTION

The present invention has for its object to avoid the above-mentioned problems of the prior art by providing a connector permitting direct insertion and removal of a printed circuit board and connector without affecting mechanically the conductive terminal pads of the board.

The invention has as another object to provide a connector for the printed circuit board permitting insertion and extraction of the board into and from a female connector which result in minimal frictional forces while at the same time producing optimum electrical connection.

The invention has as another object to provide a connector of the type mentioned above, including apparatus for latching of the board in its contacting position in the connector.

While the following discussion will exemplify the novel features of the invention by referring to the connection of a printed circuit board in a female connector body, it should be noted that these elements are only for illustrative purposes and that other uses for the invention are contemplated, e.g., a commercially produced male connector having delicate terminals might be advantageously used instead of the printed circuit board to achieve similar advantages.

In accordance with the invention, there is provided a connector for effecting a resilient pressure contact with at least one conductive surface on at least one face of a rigid structure. The connector includes a housing and a resilient contact mounted in the housing. The housing has a guide for directing the rigid structure along a path in an insertion direction, and the resilient contact has a first portion displaceable along said path and a second portion which is initially positioned out of the path, the first portion being movable by the rigid structure moving along the path in the insertion direction to flex the contact and bring the second contact portion into contact with the conductive surface on the face of the structure.

The resilient contact is of such a shape that, as the rigid structure is inserted, a bulge in the contact creates a rolling pressure against the conductive surface on the structure to thereby effect good mechanical and electrical connection to the conductive surface without the creation of destructive frictional forces.

Also according to the invention, a latching device is provided in the connector to latch the rigid structure into a fixed position within the connector. The latching device consists of a rocking element in the connector and an engageable element on the rigid structure, the two elements becoming engaged by respective stop shoulders abutting one another and being maintained in a latched position by an external biasing means. When the rigid structure is inserted in the connector, the rocking element is moved against the biasing force until the two stop shoulders engage. Unlatching is accomplished by causing the rocking element to rock in a direction to disengage the stop shoulders from one another.

BRIEF DESCRIPTION OF DRAWINGS

The invention will now be described in detail with reference to the accompanying drawings representing preferred embodiments of the connector according to the present invention. In the drawings:

FIG. 7 is a cross-sectional view of a connector as viewed from the flat side of a card to be inserted therein, and showing a latching mechanism for retaining a printed circuit board in the connector and for aiding in its release.

FIG. 8 is a cross-sectional view similar to that of FIG. 7 showing a printed circuit board in a fully inserted position.

FIG. 9 shows a cross-section of the connector similar to FIG. 8 with the circuit board in latched position.

FIG. 10 shows a cross-sectional view similar to that of FIG. 9 with the latching device in an unlatched position.

FIG. 11 shows an edge view of a printed circuit board with an engageable element thereon for latching engagement with the latching device of the connector.

DETAILED DESCRIPTION OF INVENTION

With reference to the various drawings, in the following description of the alternate embodiments of connectors according to the present invention, or in the parts of the description referring to prior art connectors, the structural elements of similar or identical configuration or operation will be identified by the same reference number.

Figure 1:
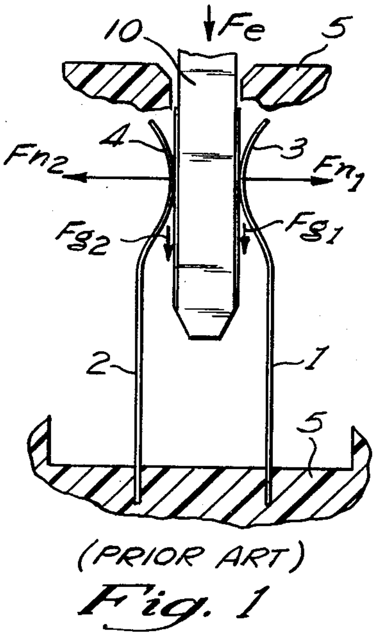
(PRIOR ART) Fig. 1
FIG. 1 is a cross-sectional view of a prior art connector of the lyre type receiving the edge of a printed circuit board.

A prior art connector having lyre type contacts is shown in FIG. 1. The resilient contacts 1 and 2 are shaped to receive one end of a PC board 10 and to clamp the board end in a connector body 5 of an insulating material. The free ends of the contacts are bent inwardly and then upwardly and outwardly so as to offer, prior to insertion, a lesser width of passage than the width of the board 10. In this manner, by applying an insertion force Fe against the card, the curved parts 3 and 4 of the receiving contacts 1 and 2 are displaced and apply lateral forces $Fn_1$ and $Fn_2$ against the board. However, when the board 10 is inserted, these lateral forces $Fn_1$ and $F_2$ induce frictional firces $Fg_1$ and $Fg_2$ upon the fragile conductor pads of the board. The invention according to the subject application is designed to eliminate the destructive frictional forces $Fg_1$ and $Fg_2$.

Figure 2:
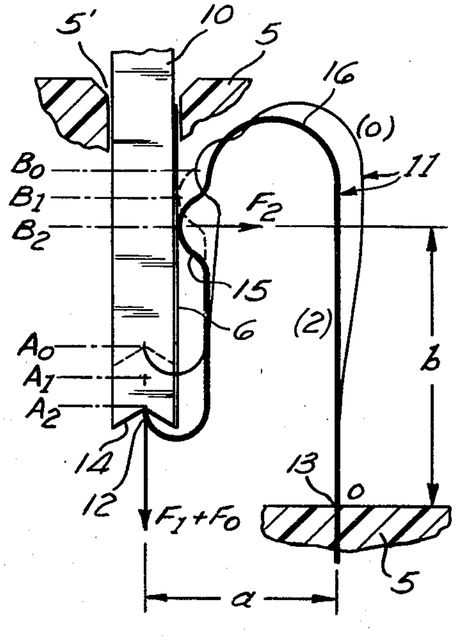
FIG. 2 is a cross-sectional view of a connector constructed in accordance with the present invention receiving the edge of a printed circuit board.

A first preferred embodiment of the connector according to the present invention is shown in FIG. 2. In FIG. 2, a resilient contact 11 is mounted with one of its ends 13 fixed in a connector body 5 of insulating material. The resilient contact 11 has the general form of a U-shaped loop 16 with a hooked free end 12, and with the fixed end 13 clamped by the body 5 preferably in a direction parallel to the insertion direction of the printed circuit board 10 (downwardly in FIG. 2).

In the initial condition of the connector, i.e., when no board 10 is inserted into the connector, the resilient contact 11 is in the position shown in fine continuous lines and marked (0), the free end 12 positioned ideally in the center of the path of the board 10. When the board 10 is introduced into the connector, the front edge 14 of the board 10, preferably notched into a V-shape as shown in FIG. 2, engages and seats the free end 12 of the contact in the initial position identified as $A_0$ in the figure. In this position, a bulge 15, formed on the inner part of the contact 11 is in the position $B_0$, spaced from the insertion path 5′ of the board 10. A slight penetration of the board 10 into the path 5′ moves the front edge 14 and the engaged free end 12 of the contact 11 into the position identified as point $A_1$. In this position of the contact 11, deformation of the contact as it pivots about its fixed end 13 brings the bulge 15 into frictionless contact with the board at $B_1$ as illustrated by dotted lines in FIG. 2, thereby making frictionless contact between contact 11 and the conductor pad 6 on the board 10. The insertion force required to move the contact end 12 from $A_0$ to $A_1$ is designated $F_1$.

Further advancement of the board 10 into the connector body 5 forces the front edge 14 of the board into the position identified as $A_2$ and is represented by a thick continuous line marked (2) in FIG. 2. In this position, the bulge 15 is in high pressure contact with the conductive pad 6 on the board 10 at point $B_2$. At full insertion of the board 10, a maximum contact pressure is developed represented by the arrow $F_2$, perpendicular to the plane of the conducting surface of the board 10. As the board is pushed into the connector from distance $A_1$ to distance $A_2$, the contact bulge 15 moves between positions $B_1$ and $B_2$, and due to the elastic characteristic of the contact 11, a continually increasing lateral pressure upon the board 10 developes the lateral contact pressure force $F_2$, and an additional component $F_0$ of insertion force is developed, the additional component of force $F_0$ contributed by the elastic characteristics of the contact 11 as end 12 moves from $A_1$ to $A_2$. It will be appreciated that, although considerable contact pressure force $F_2$ is developed, the bulge 15 during movement of the board, rolls along the conductor pad 6 of the board 10 without developing frictional forces parallel to the direction of insertion of the board, i.e., the forces $Fg_1$ and $Fg_2$ (of the device according to the prior art and represented in FIG. 1) are not present and therefore do not produce mechanical detrimental effects to the delicate conductive pads 6.

The force $F_0$ developed as the board 10 moves from position $A_1$ to $A_2$, is essentially contributed to by the flexure of the arc $OB_2$ of the contact 11. Thus, when the board 10 is completely seated, displacement of the board between points $A_0$ and $A_2$ not only gives rise to the contact pressure force $F_2$ at point $B_2$, but also produces the force $F_0$ which adds to the initial insertion force $F_1$. Due to the bulge 15, the bulk of the strong compression forces developed by deforming the contact 11 into the arc $OB_2$ is produced at the bulge 15 to insure optimum compression forces at point $B_2$. In order to keep at a minimum the total force necessary to fully seat a board, the combined force $F_1+F_0$, termed a restoring force, is kept as low as possible. As a general rule, it is preferred that $F_2>F_0<25$ g so as to avoid difficulty in inserting the board in the connector.

As can be appreciated by reference to FIG. 2, as a design choice, if either of the distances a or b is decreased, both forces $F_0$ and $F_2$ would increase, and a higher total insertion force $F_1+F_0$ would be required to seat the board.

Figure 3:
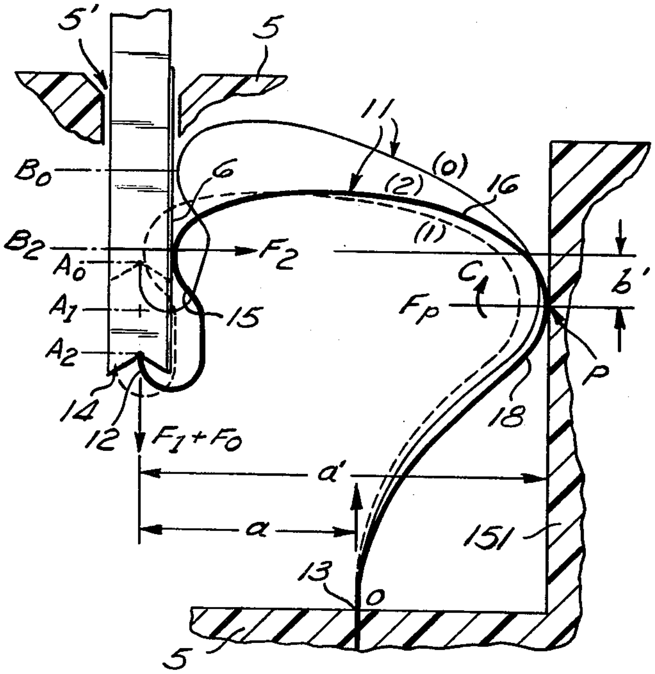
FIG. 3 is a cross-sectional view of an alternate embodiment of the present invention showing an additional vertical wall construction of the connector.

FIG. 3 shows an alternate form of the invention. In this embodiment, the resilient contact 11 is similarly arranged as that of FIG. 2, but the upper loop 16 thereof is much less curved. Additionally, the contact has a second curved portion described in the following as a bow 18, the concavity of which is in a direction perpendicular to the direction of insertion of board 10. In this embodiment, when the board 10 is inserted, and the edge 14 engages the free end 12 of the contact, the bulge 15 is again caused to come into frictionless contact with the conductor pad 6 as before described. However, since the distance between the bow 18 and the bulge 15 is designed to be greater than the distance between the conductor pad 6 and a wall 151 of the connector, further downward movement of the board 10 causes the bow 18 to engage wall 151 at point P. In FIG. 3, the fine solid line (o) shows the position of the contact as the board edge 14 just touches free end 12, the dotted line shows the position (1) that contact 11 would assume if bulge 15 did not engage conductor path 6 on the board 10, and the thick solid line (2) shows the final position and shape of the contact after the board 10 has been fully inserted. It can be appreciated that when the board edge 14 moves from position $A_0$ to $A_2$, the arcuate portion OP of contact 11 flexes first leftward, until bulge 15 touches conductive pad 6, and then rightward until bow 18 touches point P on wall 151. Again, in the fully inserted position of the board 10, the downward forces total to $F_1+F_0$, as before, but in this embodiment, due to the pressure force $F_P$ of the bow 18 against wall 151, the arcuate portion $PB_2$ of the contact is compressed between conductor pad 6 and wall 151 to create a compressive contact pressure force $F_2$ of relatively large value as compared to the distance of displacement of the card edge 14 between positions $A_1$ and $A_2$.

At the contact point P, due to the flexure of arcuate portion OP, a torque C is produced tending to move the remaining arcuate portion $PB_2A_2$ of the contact upwardly. This torque contributes partially to the total insertion force and is included in the value of force $F_0$. The total insertion force $F_{1+F2}$ is again held to a minimum to permit a reduced insertion force for the board while simultaneously producing a high contact pressure force $F_2$. A preferred distribution of forces has been found to result from satisfying the relation $F_2/F_1<a'/b'$, where a′ is the distance between the free end 12 of contact 11 and wall 151 and b′ is the vertical displacement of the relative points of contact of bulge 15 and bow 18. Variations of contact pressure and insertion forces can be realized by varying the distances a,a′, and b′, the reduction of any of the three dimensions causing an increase in contact pressure force $F_2$.

Figure 4:
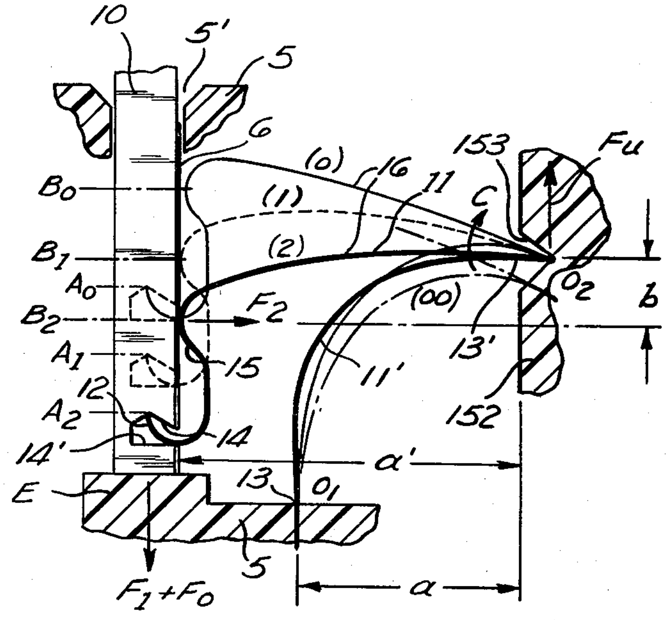
FIG. 4 is a cross-sectional view of a further alternate embodiment of the invention showing a pivotal engagement of one part of the resilient contact in a notch formed in one wall of the connector.

In FIG. 4, a further embodiment of the connector according to the present invention is shown, wherein the contact 11 is essentially made up of two portions meeting and joined at a vertex point $O_2$. The contact according to this embodiment experiences a buckling action to snap the loop portion 16 into two stable states. The contact in FIG. 4 will be described as having an active contact part 11 and a balancing part 11′, the balancing part 11′ having both of its ends 13 and 13′ fixed at positions $O_1$ in body 5 and $O_2$ in notch 153 formed in wall 152.

In the FIG. 4 embodiment, the fine continuous line (O) represents the initial position of the contact before board insertion, the dotted line (1) represents the point of maximum contact pressure of the bulge 15 against conductor pad 6, and the thick solid line (2) represents the contact in the position taken when the board 10 is fully inserted.

In this embodiment, the balancing part 11′ of contact 11 is prestressed between points $O_1$ and $O_2$, the dash/-dot line (OO) indicating the natural position of vertex $O_2$ if wall 152 and notch 153 were not present. Upon insertion of board 10, the arcuate portion $O_2B_0$ is submitted to a buckling force that becomes maximum when the bulge 15 is at point $B_1$ directly opposite from point $O_2$. This position defines the unstable condition of the contact. With continued lowering of the board 10 until edge 14 reaches point $A_2$, further movement is limited by the stop E formed in the lower part of body 5, and the second stable position (2) of active portion 11 is reached. In this position, the contact pressure force $F_2$ is contributed to by the holding of free end 12 in recess 14 and a tendency for the arcuate portion $O_2B_2$ to be rotated about $B_2$ by a force Fu developed due to the fact that the contact portion 13' is initially raised in the direction of Fu and restrained from movement in notch 153. The active contact portion 11 tends to be further exerted upwardly by the action of balancing part 11' due to the fact that, in the fully inserted position (2), the balancing part 11' causes a torque C to be applied to active portion 11 pivoting about point $O_2$. With proper selection of the distance between points $A_0$ and $A_2$, the distance a' between the board 10 and the wall 152, the distance between point $O_2$ and $B_0$, and the distance b between the height of $O_2$ and $B_2$, an optimum contact pressure $F_2$ is obtained. Simultaneously a counterbalancing force due to torque C, as determined in part by the distance a, will be produced to counterbalance the total insertion force and thus permit the board to be inserted and withdrawn with an average net insertion or withdrawal force of zero. Due to the snap action of active contact parts 11, with point $B_2$ downstream (in the insertion direction) of vertex $O_2$, the component of insertion force $F_0$ is negative. To achieve a net zero insertion force then, $F_1$ plus the restoring force resulting from torque C must equal $F_0$, in absolute values. This configuration, with the reduced or nonexistant insertion force avoids the need for a latching device for mechanically maintaining the board in the connector.

In the FIG. 4 embodiment, since the fully inserted position of board 10 causes contact 11 to assume a stable state, it may be necessary to provide recess 14 in the form of an opening so that a ledge 14' will aid in lifting the contact 11 upwardly as the board is removed.

Figure 6:
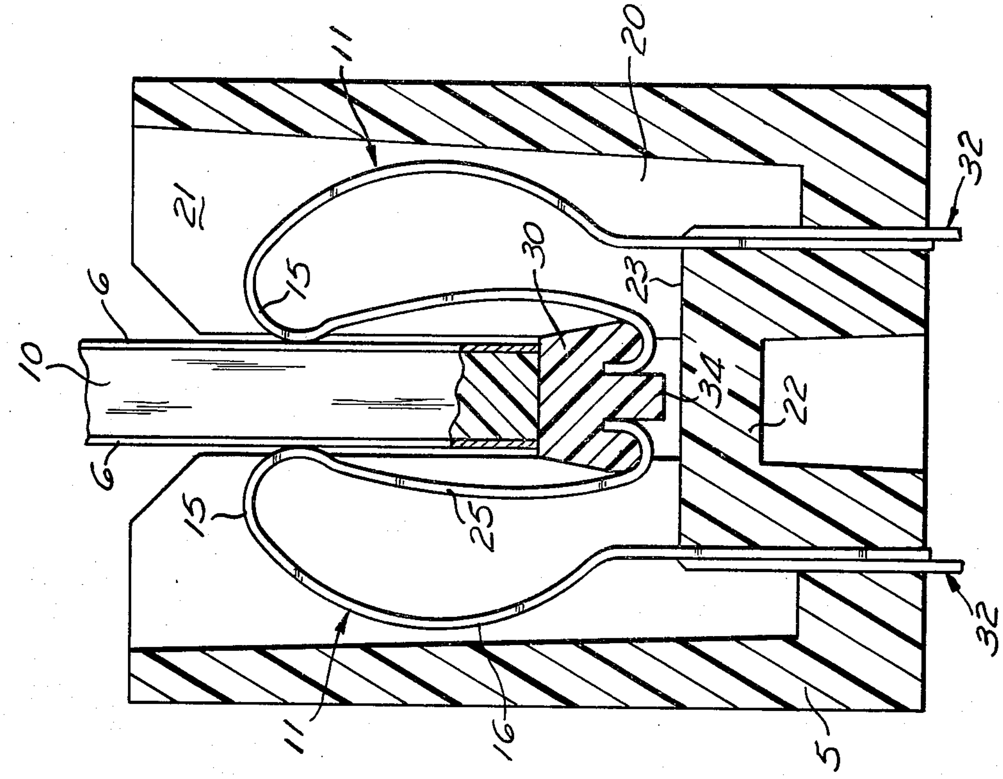
FIG. 6 shows the embodiment of the invention according to FIG. 5 with a printed circuit card inserted therein.
Figure 5:
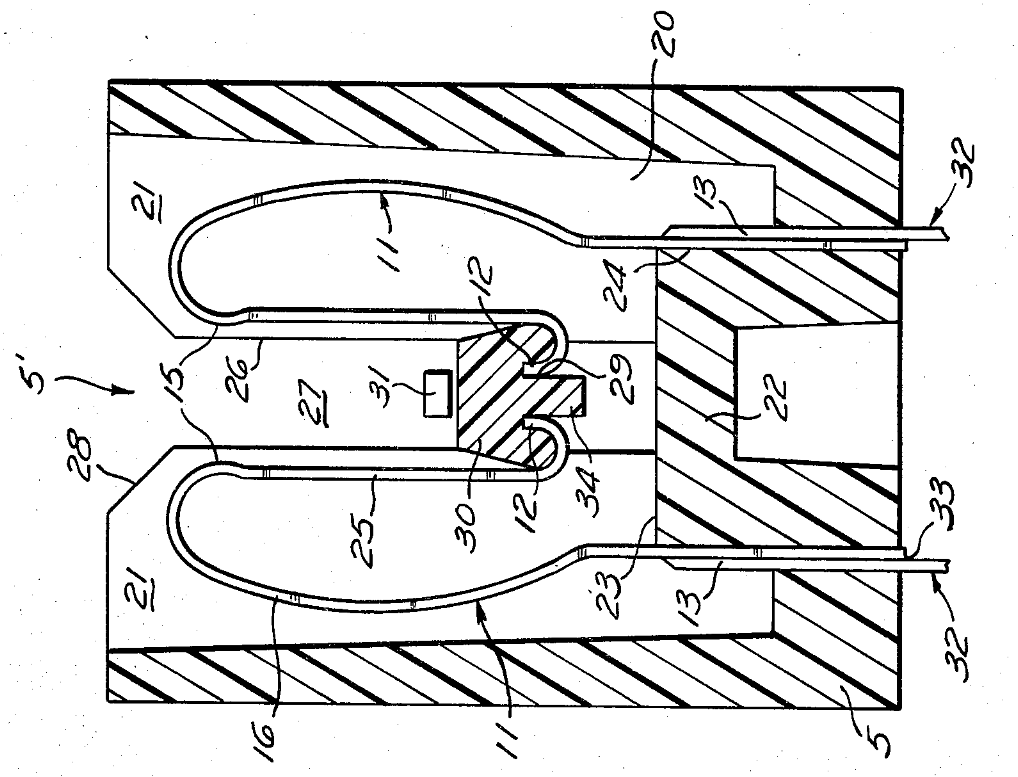
FIG. 5 shows a vertical cross-section of a connector having a pair of contacts of the type shown in FIG. 2, and showing a coupling bar joining paired contacts and adapted to receive the edge of a printed circuit board inserted in the connector.

In FIGS. 5 and 6, an embodiment of the invention employing a pair of opposed contacts of the type shown in FIG. 2 is illustrated. FIG. 5 shows the position the contact takes prior to inserton of a board, and FIG. 6 is the form the contact takes upon full insertion of the board in the connector. Typically, the body 5 of the connector is of insulative material in the form of a parallelepiped having inner cavities 20 longitudinally separated by transverse partitions 21. A central elevated portion 22 having an upper surface 23 is provided to form a stop abutment to limit the depth of insertion of the board into the connector. Lateral sides 24 serve as a support for the fixed end 13 of the contact 11. A rectilinear portion 25 of the contact is aligned parallel to the insertion path 5' defined by edges 26 of partitions 21. Beveled surfaces 28 of the partitions 21 guide the board into the path 5'.

Rather than provide recesses in the edge 14 of the board 10 to be inserted, a coupling bar 30 may be provided as a part of the connector to attach to the free end 12 of the contact (or plurality of contacts). In FIGS. 5 and 6, a pair of opposed contacts, representing one pair of a plurality of pairs along the length of a connector body, are shown to be contained in recesses 29 of coupling bar 30. Coupling bar 30 is prevented from upward movement by a protrusion 31 on one end of the connector body 5. Connecting terminals 32 are fitted into the lower part of the body 5 and are mounted so as to establish an electrical connection at 33 with the fixed ends 13 of the contact 11, for example by soldering, crimping, winding, etc. Penetration of the board 10 into the connector is limited in the example shown in FIGS. 5 and 6 by a projection 34 of the coupling bar 30, this projection 34 abutting against the stop abutment 23.

FIGS. 7-10 show a latching arrangement in which a printed circuit board 10 can be latched against the biasing forces of the plurality of contacts tending to urge the board out of the connector. Such a latching assembly is particularly useful with the embodiments of the invention according to FIGS. 2 and 3, although it might also be used with the FIG. 4 embodiment if additional security against mechanical dislodgement of the board is desired. As seen in plan view of FIGS. 7-10 and in edge view of FIG. 11, the circuit board 10 can have an engageable element 35 mounted to the corner thereof, the element protruding in a truncated V-shape 36 beyond the font edge of the board 10 and protruding in a hook-shape 37 laterally of the board. The element 36 cooperates with a recess 38 formed in the longitudinal end of coupling bar 30. A wing 39 of bar 30 extends perpendicular to the bar 30 and parallel to the direction of insertion of board 10. Wing 39 is adapted to slide against a wall 40 of a channel 41 formed in the body 5. The free end of the wing 39 is beveled to cooperate with the upper sloping surface of a slide 42 capable of being slid vertically in channel 41, the slide 42 being drawn upwardly by a spring 46 attached to a rocking latch 43 which may pivot about one of two pivot pins 44 or 45 in respective bearing surfaces 50, 51.

A channel 41 is formed at one or both extreme ends of the connector body 5 and a latching device, generally designated as L, is also located at one or both ends of the connector.

The latching device operates according to the various positions shown in FIGS. 7-10. In FIG. 7, the spring 46, attached to upper support 47 on rocking latch 43 and to lower support 48 on slide 42 causes the rocking latch 43 to abut against the outer edge of ear 53 extending laterally of the end of bar 30, and to abut against cam surface 59 of slide 42.

As the board 10 is forced downward under force $F_A$, as shown in FIG. 8, element 35 passes through passageway 54 and is seated in recess 38 driving bar 30 and wing 39 downwardly against the biasing force of spring 46 until bar 30 is stopped against raised surface 23. After the ear 53 is force to below retaining tip 52 of rocking latch 43, the retaining tip 52 is drawn to the left, in FIG. 8, under the horizontal pulling force of spring 46, and the movement of slide 42 downwardly by wing 39 permits leftward movement of cam surface 49 of rocking latch 43 also under the horizontal pulling component of force offered by spring 46. In the board position of FIG. 8, the hook 37 is pushed beyond (lower than) the retaining tip 52, and the rocking latch 43 rests with its upper bearing surface 50 on the upper surface of pivot pin 44.

When the downward force $F_A$ is released from the board 10, spring 46 tends to push slide 42, wing 39, bar 30 and board 10 upwardly until the tip of ear 53 engages the lower stop of retaining tip 52 and the ear 53 is contained fully within the shallow pocket 43' formed in one face of rocking latch 43. The slight upward movement of board 10 now permits full containment of pivot pin 44 in the upper bearing surface 50 and simultaneously permits rocking element 43 to be further drawn to the left and away from pivot pin 45, as can be seen in the position shown in FIG. 9.

To release the board 10 from latching engagement with the connector, FIG. 10 shows that a downward force $F_B$ applied to the board 10 again causes slide 42 to be driven downwardly, and since rocking latch 43 is now pivoting about pivot pin 44, the cam surface 49 is permitted to move even further to the left than in the FIG. 9 position. In the FIG. 10 position, the biasing force of the spring tends to rotate the rocking latch 43 further about pivot pin 44, but is stopped from doing so by the lower bearing surface 51 abutting pivot pin 45 on its upper surface. With retaining tip 52 drawn to the right, board 10 may be removed to pass hook 37 by retaining tip 52. As bar 30 is permitted to rise upwardly under the force of spring 46 acting on slide 42, ear 53 passes by retaining tip 52, and the cam surface 59 of slide 42 cams against camming surface 49 to reposition the rocking latch in the FIG. 7 position.

With reference to FIG. 7, the distances x and y between pivot pins 44 and 45 are determined so that in a first position of equilibrium, i.e., with the rocking latch 43 pivoting about pin 45, the retaining tip 52 is spaced from ear 53 and out of the way of passageway 54. The distances separating the two pins 44 and 45 are also determined so that the rocking latch 43, in its latching position shown in FIG. 9 is in its second stable state as discussed above.

Figure 12A:
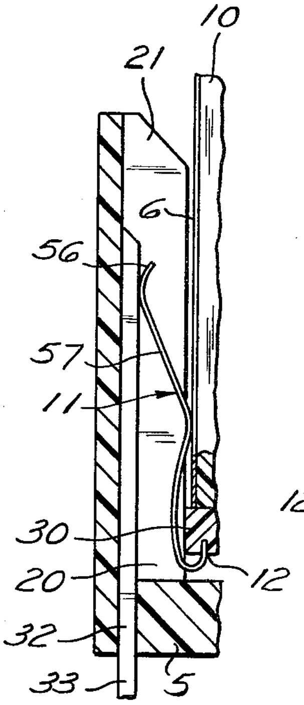
FIGS. 12A and 12B are cross-sectional views showing yet another alternate embodiment of the invention.
Figure 12B:
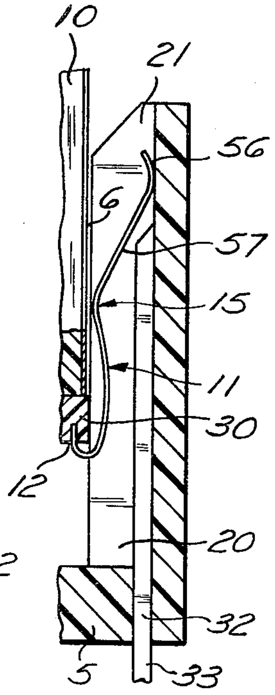

FIGS. 12A and 12B show another embodiment of the invention in which the contact 11 always has one of its ends 12 engaged with bar 30. In this embodiment the contact does not form a loop, and the bulge 15 is produced by a bend in the contact forming an extension 55 having an inwardly bent tip 56 at the free end thereof. In this embodiment, the contact 11 is maintained between the bar 30 and a corresponding wall of the body cavity 20. The terminals 33 extend within cavity 20 to such a height as to accommodate in sliding contact the tip 56 when the board 10 is fully inserted and for a predetermined length of travel until the board is removed, at which time the tip 56 slides off of terminal 33 and disconnects therefrom. FIG. 12A shows the fully extended, contacting position of the contact 11, while FIG. 12B shows the completely withdrawn position of the board 10. It can be appreciated that with the free end 12 of the contact fixed to bar 30, the bulge 15 makes a frictionless pressure contact against board 10.

The embodiments of FIGS. 12A and 12B have the advantage of not requiring a latching mechanism to latch the board in the connector, since the contacts do not tend to push the board upwardly as with other embodiments of the invention. On the other hand, the front edge 14 of the board and the bar must be mechanically coupled, and this can be accomplished by the arrangement later to be described in connection with FIG. 15.

Figure 13:
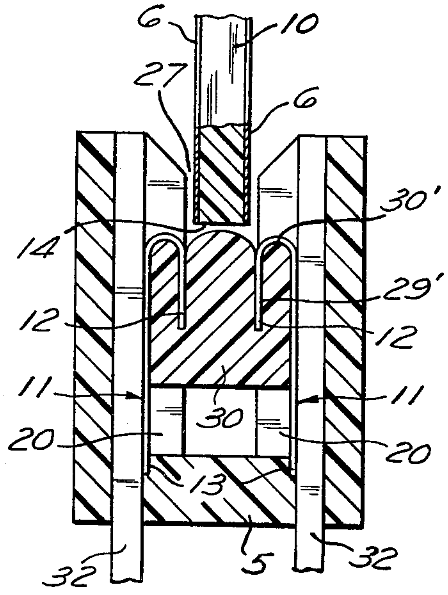
FIG. 13 shows a cross-section of a further alternate embodiment of the invention.
Figure 14:
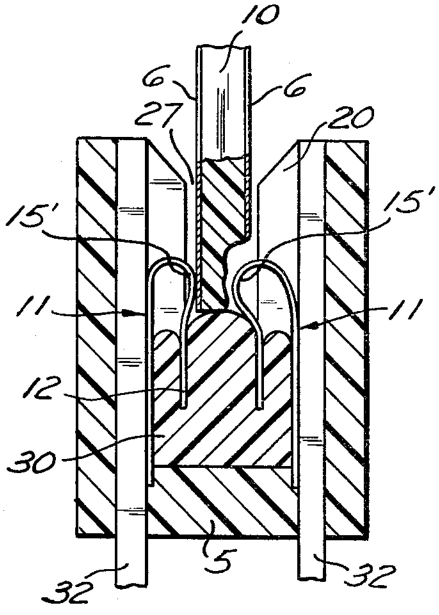
FIG. 14 shows a cross-sectional view of the connector of FIG. 13 with a printed circuit board inserted therein.

In FIGS. 13 and 14, a further embodiment of the connector according to the invention is shown. In this embodiment, the contacts 11 are again of a U-shaped loop form with the lower part 13 clamped between the body and terminal 32. However, in this embodiment, the other end 12 of the contact 11 is not bent upwardly as in other embodiments (e.g., FIGS. 5 and 6), but is clamped into slots 29' and bent over curved edge portions of bar 30 conformed to the shape of contact 11.

When the board 10 is inserted into the passageway 27, and pushes bar 30 in a downward direction, the lateral walls of bar 30 slide along the straight parts of contact 11 lying against terminal 32. FIG. 14 shows, in the left half thereof, a bulging configuration resulting in frictionless pressure contact by the curved part 15' against circuit board 10, the bulge configuration being produced by the elasticity characteristic of the contact 11 opposing the traction force applied to the end 12 by the downward placement of bar 30. The flexure of the contact 11 is limited laterally by the walls of the cavities 20. The right half section of FIG. 14 represents the shape of the contact 11 when the bar 30 is lowered in the absence of a board 10, the distance of lateral movement of bulge 15' in the passageway 27 determining the force of contact pressure between bulge 15' and board 10. In this embodiment, as in the one represented in FIG. 12, no retracting force is applied upon the board 10 inserted into the connector so that the latching mechanisms previously described are not necessary. However, as previously mentioned, the board 10 and the bar 30 must have co-engaged portions so as to be able to bring the contacts in the connector back to their original position shown in FIG. 13 upon withdrawal of the board.

Figure 15:
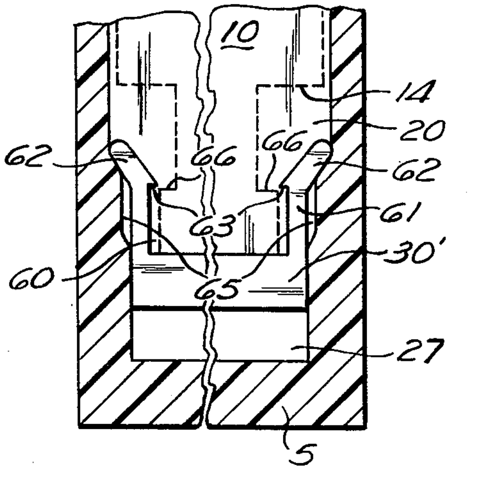
FIG. 15 shows a cross-sectional view of a connector with printed circuit board latching means on each end thereof.

For returning the contacts to their original positions as shown in FIGS. 12B and 13, the arrangement of FIG. 15 is utilized. In FIG. 15, the longitudinally spaced ends of the board 10 and the bar 30 are provided with cooperating extraction means which serve a similar purpose as the latch devices shown in FIGS. 7–11. According to the embodiment of FIG. 15, the end of bar 30' is formed with a cavity 60 formed by the configuration of two arms 61 leading to flanges 62 extending upwardly and angularly outwardly. Shoulders 63 along the walls of the cavity 27 serve to cam flanges 62 inwardly when a board is inserted to push bar 30' downwardly. The board 10 is provided at its extreme edge with short lateral projections 64 defining upper ledges 66, the distance between projections 64 being slightly smaller than the width separating the arms 61. As the board is pushed downwardly, flanges 62 are cammed inwardly, and shoulders 63 are positioned above ledges 66 and spaced a distance less than the distance between projections 64. In this manner, when the board 10 is moved upwardly, the ledges 66 contact shoulder 63 and bring the bar 30 to its initial position, as required. The flanges 62 return to their initial position by the inherent elasticity thereof.

Figure 17:
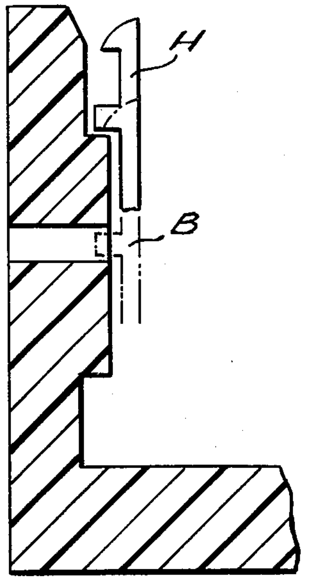
(PRIOR ART) Fig. 17
FIG. 17 shows a partial cross-sectional view of a portion of the lyre-type contact of FIG. 16 in its two extreme positions in a connector body.
Figure 16:
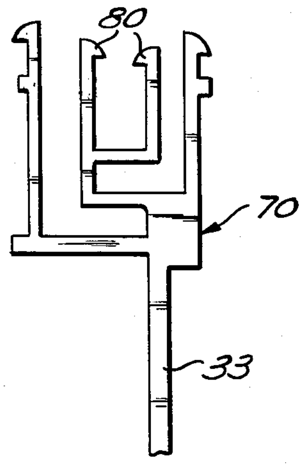
(PRIOR ART) Fig. 16
FIG. 16 shows a prior art form of lyre type contact which is adjustable to make delayed connection with a printed circuit board upon insertion in the connector.
Figure 18:
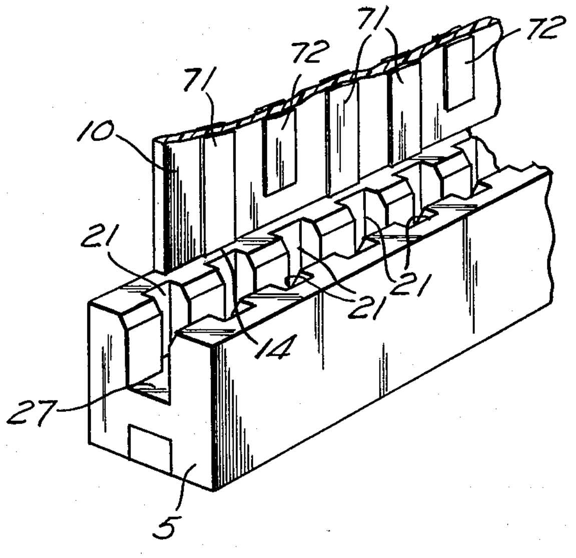
FIG. 18 is a perspective view of a connector receiving a printed circuit board with conductor paths alternatively meeting and not meeting the edge of the board.

It should be noted that in prior art connectors and in the embodiment of the present invention according to FIGS. 13 and 14, an immediate electrical connection between the contacts 11 and the conductor pads 6 on the board 10 is made. In modern circuitry, it is often desirable or necessary to effect electrical contact with some conductor pads of the PC board before others. To accomplish this, the terminal conductor pads of the PC board are brought fully to the edge of the board or not depending upon, respectively, whether or not immediate electrical connection is to be made. This is illustrated in the board perspective view of FIG. 18, wherein conductor pads 71 are brought to the edge of the card and conductor pads 72 fall short thereof. In the usual prior art connector of the lyre type, such as the one represented in FIGS. 16 and 17, there is no possibility for making selective contact with the two types of conductor pads 71 and 72 while maintaining the contact at the same level for all positions of the connector. Accordingly, attempts have been made to construct a lyre type contact (FIG. 16) which can be positioned in two selectable positions H or B in the connector housing 5', depending upon whether or not that contact is to have an immediate connection with a conductor pad on the board. Thus, depending upon the function of the card and the distribution of circuits on the card, the user must determine and effect himself the proper placement of the lyres 70 in the connector which produce the desired results. This, obviously, causes problems of adaptation and considerable loss of time in time of assembly. This problem is solved by the present invention, especially with reference to FIGS. 13 and 14, wherein the entire series of contacts 11 establish electrical connection with the extreme tips of the conductor pads on the board 10 and then maintain, by rolling of the bulge 15 on the face of the board, immediate contact with conductor pads 71 and delayed contact with conductor pads 72 (FIG. 18). Accordingly, unlike the prior art arrangement of FIGS. 16 and 17, the connector of the present invention can have a plurality of identical contacts 11 and yet perform the required function.

From the foregoing, it can be readily realized that this invention can assume various embodiments. Specifically, the general conformation of the cavities shown in the structures illustrated and the general form of the connector bodies may be adapted to various applications without having to depart from the operational and structural characteristics of the invention. Further, the materials selected for the various elements of the invention are non-limiting, e.g., the resilient contacts can be formed of cuprous alloys (of phosphor bronze, of brass, or of cuprous beryllium, and like materials). The flexibility of the contacts might be improved by forming them as slotted blades, or for added strength, a plurality of bulges may be provided in place of the single bulge 15 described herein. Thus, it is to be understood that the invention is not limited to the specific embodiments described herein, but is limited only by the appended claims.

We claim:

1. A connector for effecting a resilient pressure contact with at least one conductive surface on at least one face of a rigid structure, said connector comprising:

a housing have a guide for directing the rigid structure along a path in an insertion direction;

and a resilient contact mounted in said housing and having a first portion initially positioned in said path and a second portion initially positioned out of said path;

said first contact portion being movable by a forward edge of the structure, as the structure moves along said path in said insertion direction, to flex said contact and bring said second contact portion into frictionless contact with the conductive surface on the face of the structure;

a latching device for latching engagement with an engageable element on at least one corner of the forward edge of said structure, said latching device comprising: means for receiving the edge of said structure, and responsive to movement thereof in said insertion direction to capture and hold said engageable element; and wherein said means for receiving the edge of said structure comprises: a rocking latch member having first and second bearing surfaces;

first and second pivot pins about which said bearing surfaces pivot; and resilient means for biasing said latch selectively to engage one of said first and second pivot pins in one of said first and second bearing surfaces, respectively, thereby defining first and second stable latch positions for said rocking latch.

2. The connector as claimed in claim 1, wherein said means for receiving the edge of said structure includes an actuator movable between first and second actuator positions; said actuator includes an ear and a spaced cam surface; said rocking latch includes a retaining tip engageable by said ear and a third bearing surface engageable by said cam surface; whereby before insertion of said structure in said connector said actuator is in said first actuator position and said rocking latch is in said first stable position and said third bearing surface abuts said cam surface to force said first bearing surface to bear against said first pivot pin, thereby placing said ear in a position to block said retaining tip from being engageable with said engageable element on said structure.

3. The connector as claimed in claim 2, wherein after said structure is inserted in said connector, said actuator is forced by said structure to said second actuator position to cause said cam surface to move away from said third bearing surface, and said actuator and said resilient means cooperate to rock said rocking latch toward said second stable position, thereby forcing said second bearing surface to bear against said second pivot pin, placing said ear in a position to unblock said retaining tip and to permit said retaining tip to engage said engageable element.

4. The connector as claimed in claim 3, whereby upon further movement of said structure in said insertion direction, said actuator and said resilient means cooperate to rock said rocking latch, about said second pivot pin, to said first stable position, whereby said retaining tip is positioned out of engagement with said engageable element for unobstructed withdrawal of said structure.

5. A connector having at least one resilient contact for effecting a resilient pressure contact with at least one conductive surface on at least one face of a rigid structure, said connector comprising:

a housing having a guide for directing the rigid structure along a path in an insertion direction; and a latching device for latching engagement with an engageable element on at least one corner of the forward edge of said structure, said latching device comprising:

means for receiving the edge of said structure, and responsive to movement thereof in said insertion direction to capture and hold said engageable element, wherein said means for receiving the edge of said structure comprises:

a rocking latch member having first and second bearing surfaces;

first and second pivot pins about which said bearing surfaces pivot; and resilient means for biasing said latch selectively to engage one of said first and second pivot pins in one of said first and second bearing surfaces, respectively, thereby defining first and second stable latch positions for said rocking latch.

6. The connector as claimed in claim 5, wherein: said means for receiving the edge of said structure includes an actuator movable between first and second actuator positions; said actuator includes an ear and a spaced cam surface; said rocking latch includes a retaining tip engageable by said ear and a third bearing surface engageable by said cam surface; whereby before insertion of said structure in said connector said actuator is in said first actuator position and said rocking latch is in said first stable position and said third bearing surface abuts said cam surface to force said first bearing surface to bear against said first pivot pin, thereby placing said ear in a position to block said retaining tip from being engageable with said engageable element on said structure.

7. The connector as claimed in claim 6, wherein after said structure is inserted in said connector, said actuator is forced by said structure to said second actuator position to cause said cam surface to move away from said third bearing surface, and said actuator and said resilient means cooperate to rock said rocking latch toward said second stable position, thereby forcing said second bearing surface to bear against said second pivot pin, placing said ear in a position to unblock said retaining tip and to permit said retaining tip to engage said engageable element.

8. The connector as claimed in claim 7, whereby upon further movement of said structure in said insertion direction, said actuator and said resilient means cooperate to rock said rocking latch, about said second pivot pin, to said first stable position, whereby said retaining tip is positioned out of engagement with said engageable element for unobstructed withdrawal of said structure.

9. A connector for effecting a resilient pressure contact with at least one conductive surface on at least one face of a rigid structure, said connector comprising:

a housing having a guide for directing the rigid structure along a path in an insertion direction;

and a resilient contact mounted in said housing and having a first portion initially positioned in front of the rigid structure in said path and a second portion initially positioned out of said path;

said first contact portion being movable by a forward edge of the structure, as the structure moves along said path in said insertion direction, to flex said contact and bring said second contact portion into contact with the conductive surface on the face of the structure absent substantially any relative frictional contact therewith, wherein said first contact portion is one end of said contact and is movable with, and displaced along said path in said insertion direction by said structure and said second contact portion comprises a bulge formed in said contact, said bulge spaced from said one end in a direction opposite said insertion direction; and engagement means for maintaining a firm engagement of the rigid structure by said one end of said contact to thereby maintain a fixed point of contact of said bulge on the conductive surface of the structure wherein said engagement means comprises a hook at the end of said first contact portion for engagement in a recess provided in the rigid structure.

10. A connector for effecting a resilient pressure contact with at least one conductive surface on at least one face of a rigid structure, said connector comprising:

a housing having a guide for directing the rigid structure along a path in an insertion direction;

and a resilient contact mounted in said housing and having a first portion initially positioned in front of the rigid structure in said path and a second portion initially positioned out of said path;

said first contact portion being movable by a forward edge of the structure, as the structure moves along said path in said insertion direction, to flex said contact and bring said second contact portion into contact with the conductive surface on the face of the structure absent substantially any relative frictional contact therewith, wherein said first contact portion is one end of said contact and is movable with, and displaced along said path in said insertion direction by said structure and said second contact portion comprises a bulge formed in said contact, said bulge spaced from said one end in a direction opposite said insertion direction;

said contact including a third portion at the end of said contact remote from said one end and fixed to said housing along a plane parallel to said insertion direction; and said housing including a wall spaced from said guide, said contact having a bow between said bulge and said third portion, and said bulge being spaced from said bow slightly farther than said wall from the structure in said guide, to thereby create a first force between said structure and said bulge and a second force between said bow and said wall upon movement of said first contact portion in said insertion direction.

11. The connector as claimed in claim 10, wherein said bow contacts said wall at a point downstream, in said insertion direction, of the point of contact between said bulge and the conductive surface of a fully inserted structure, to thereby develop a torque about the point of contact of said bow with said wall tending to move said first end of said contact in a direction opposite to said insertion direction.

12. A connector for effecting a resilient pressure contact with at least one conductive surface on at least one face of a rigid structure, said connector comprising:

a housing having a guide for directing the rigid structure along a path in an insertion direction;

and a resilient contact mounted in said housing and having a first portion initially positioned in front of the rigid structure in said path and a second portion initially positioned out of said path;

said first contact portion being movable by a forward edge of the structure, as the structure moves along said path in said insertion direction, to flex said contact and bring said second contact portion into contact with the conductive surface on the face of the structure absent substantially any relative frictional contact therewith, wherein said first contact portion is one end of said contact and is movable with, and displaced along said path in said insertion direction by said structure and said second contact portion comprises a bulge formed in said contact, said bulge spaced from said one end in a direction opposite said insertion direction;

said contact including a third portion at the end of said contact remote from said one end and fixed to said housing along a plane parallel to said insertion direction; and said contact having a fourth portion defining a vertex from which said contact extends in two substantially parallel segments, the first segment comprising said first and second contact portions, and the second segment curving away from said first part to form said third contact portion, said housing having a wall spaced from said guide, said wall having a notch therein for receiving said vertex and said vertex being spaced from said bulge slightly farther than from the structure in said guide to thereby create a force between said structure and said bulge and a force between said vertex and said notch upon movement of said first contact portion in said insertion direction.

13. The connector as claimed in claim 12, wherein said second segment is prestressed between said vertex and its fixed point on said housing to form a convex arc, a portion of said convex arc adjacent said vertex bearing on a portion of said first segment adjacent said vertex to induce a torque on said first segment about said vertex, thereby applying a force tending to move said one end of said contact in a direction opposite to said insertion direction.

14. A connector for effecting a resilient pressure contact with at least one conductive surface on at least one face of a rigid structure, said connector comprising:

a housing having a guide for directing the rigid structure along a path in an insertion direction;

at least one opposing pair of contacts mounted in said housing, each said contact having a first portion initially positioned in front of the rigid structure in said path and a second portion initially positioned out of said path;

said first contact portions being movable by a forward edge of the structure as the structure moves along said path in said insertion direction to flex said contacts and bring said second contact portions into contact with the conductive surface on the face of the structure absent substantially any relative frictional contact therewith wherein each said first contact portion is one end of said contact and each said one end is movable with and displaced along said path in said insertion direction by said structure; and a coupling bar, said bar comprising a bottom surface having recesses therein for tightly receiving said one ends of said contacts and a top surface for engagement by the forward portion of the rigid structure.

15. The connector as claimed in claim 14, wherein said movement of said bar in a direction opposite said insertion direction is limited by a protrusion on said connector housing serving as a stop for said top surface of said bar.

16. The connector as claimed in claim 14, wherein said bar includes a projection extending between said one end and engageable with a raised portion of said connector housing from limiting movement of said bar in said insertion direction.

17. A connector for effecting a resilient pressure contact with at least one conductive surface on at least one face of a rigid structure, said connector comprising:

a housing having a guide for directing the rigid structure along a path in an insertion direction;

and a resilient contact mounted in said housing and having a first portion initially positioned in front of the rigid structure in said path and a second portion initially positioned out of said path;

said first contact portion being movable by a forward edge of the structure, as the structure moves along said path in said insertion direction, to flex said contact and bring said second contact portion into contact with the conductive surface on the face of the structure absent substantially any relative frictional contact therewith, and a contact return means, said contact return means comprising a movable bar extending lengthwise of said connector and having at least one outwardly directed hooked flange and at least one cooperating cam shoulder on said connector housing for camming said hooked flange inwardly to thereby capture a projection on the forward edge of the structure.

18. The connector as claimed in claim 17, including: a slide mounted in said housing for reciprocal movement along said path; and electrical terminals along an interior wall of said housing, said resilient contact having a third portion sandwiched between said slide and said terminals, said slide clamping said first portion of said contact for reciprocal movement therewith, said slide having an abutment against which a forward edge of the structure bears to move said slide and said first portion in said insertion direction.

19. A connector for effecting a resilient pressure contact with at least one conductive surface on at least one face of a rigid structure, said connector comprising:

a housing having a guide for directing the rigid structure along a path in an insertion direction;

a resilient contact mounted in said housing and having a first portion initially positioned in front of the rigid structure in said path and a second portion initially positioned out of said path;

said first contact portion being one end of said contact and being movable by a forward edge of the structure as the structure moves along said path in said insertion direction to flex said contact and bring said second contact portion into contact with the conductive surface on the face of the structure absent substantially any relative frictional contact therewith wherein said one end is movable with and displaced along said path in said insertion direction by the structure and wherein said second contact portion comprises a bulge formed in said contact, said bulge being spaced from said one end in a direction opposite to said insertion direction; and engagement means for maintaining a firm engagement of the rigid structure by said one end of said contact to maintain a fixed point of contact of said bulge on the conductive surface of the structure whereby said one end of said contact and said bulge translate in a direction corresponding to said insertion direction.

20. The connector as claimed in claim 19, wherein, after initial contact between said bulge and the conductive surface of the structure, further movement of the structure in the insertion direction causes a rolling contact of said bulge along said conductive surface.

21. The connector as claimed in claim 19, wherein said contact includes a third portion at the end of said contact remote from said one end and fixed to said housing along a plane parallel to said insertion direction.

22. The connector as claimed in claim 19, wherein said contact has a third portion frictionally slideable along an interior wall of said housing, and said housing includes contact terminals ending in a camming surface adjacent the entry of said path for camming said third portion inwardly as said structure moves in said insertion direction, said second portion being out of said path when said third portion is not cammed inwardly and said second portion is in frictionless pressure contact with said conductive surface on said structure when said third portion is cammed inwardly by said camming surface.

* * * * *